US006642704B2

(12) United States Patent
Hastings et al.

(10) Patent No.: US 6,642,704 B2
(45) Date of Patent: Nov. 4, 2003

(54) DEVICE FOR SENSING ELECTRICAL CURRENT AND HOUSING THEREFOR

(75) Inventors: Jerome K. Hastings, Sussex, MI (US); Davin R. Lee, Watertown, MI (US)

(73) Assignee: Eaton Corporation, Cleveland, OH (US)

( * ) Notice: Subject to any disclaimer, the term of this patent is extended or adjusted under 35 U.S.C. 154(b) by 6 days.

(21) Appl. No.: 09/967,426

(22) Filed: Sep. 28, 2001

(65) Prior Publication Data

US 2003/0062886 A1 Apr. 3, 2003

(51) Int. Cl.[7] .................................................. G01R 1/20
(52) U.S. Cl. ............................... 324/117 H; 324/117 R
(58) Field of Search .............................. 324/117 R, 126, 324/127, 772, 545, 142, 117 H; 318/490

(56) References Cited

U.S. PATENT DOCUMENTS 5,124,642 A * 6/1992 Marx .......................... 324/127
5,397,982 A * 3/1995 Van Lankvelt .............. 324/126

* cited by examiner

Primary Examiner—Kamand Cuneo
Assistant Examiner—Russell M. Kobert
(74) Attorney, Agent, or Firm—John A. Kastelic; Mitchell M. Musial, III

(57) ABSTRACT

Disclosed herein is a sensor assembly (10) for attachment to an electrical conductor (5), which includes a base (20) having a cavity (22) and a pair of detector housings (30) extending from the base (20). The detector housings (30) are laterally spaced and substantially parallel and are provided to receive a magnetic field detector. An electronic circuit card (70) is disposed within the base cavity (22) and is operatively coupled to the magnetic field detectors. Additionally, an auxiliary circuit card (90)) that contains logic for detecting an arc fault may be provided for communicating with the electronic circuit card (70).

9 Claims, 6 Drawing Sheets

DEVICE FOR SENSING ELECTRICAL CURRENT AND HOUSING THEREFOR

FIELD OF THE INVENTION

The present invention relates to electrical component mounting and assemblies.

BACKGROUND OF THE INVENTION

Electrical sensors of various types are used to detect the current flowing through a conductor. Such sensors include a single hall effect sensor that produce an output voltage indicative of the current magnitude as well as more conventional current sensors such as a shunt resistor. Non conventional current sensors that employ a pair of magnetic field detectors have special requirements. One of these requirements is that the magnetic field detectors are parallel to one another. Another requirement may be that the electronic circuit card is disposed as closely as possible to the magnetic field detectors for purposes such as packaging, convenience and noise suppression. Furthermore, it may be advantageous to provide a current sensor assembly that may be mounted to conductors having various sizes and shapes. The present invention provides a current sensor assembly that maintains a pair of magnetic field detectors parallel to one another and closely disposed to an electronic circuit card. Furthermore the magnetic field detectors are selectively adjustable in order to be attached to a variety of electrical conductors.

SUMMARY OF THE INVENTION

A sensor assembly for attachment to an electrical conductor is disclosed. The assembly includes a base having a cavity and a pair of detector housings extending from the base. The detector housings are laterally spaced and substantially parallel. Each of the detector housings have a cavity for receiving a magnetic field detector. A magnetic field detector is disposed in each of the detector housings. An electronic circuit card is disposed within the base cavity and is operatively coupled to the magnetic field detectors.

Further objects, features and advantages of the present invention will become apparent to those skilled in the art from analysis of the following written description, accompanying drawings and appended claims.

DESCRIPTION OF THE PREFERRED EMBODIMENT OF THE PRESENT INVENTION

Figure 1:
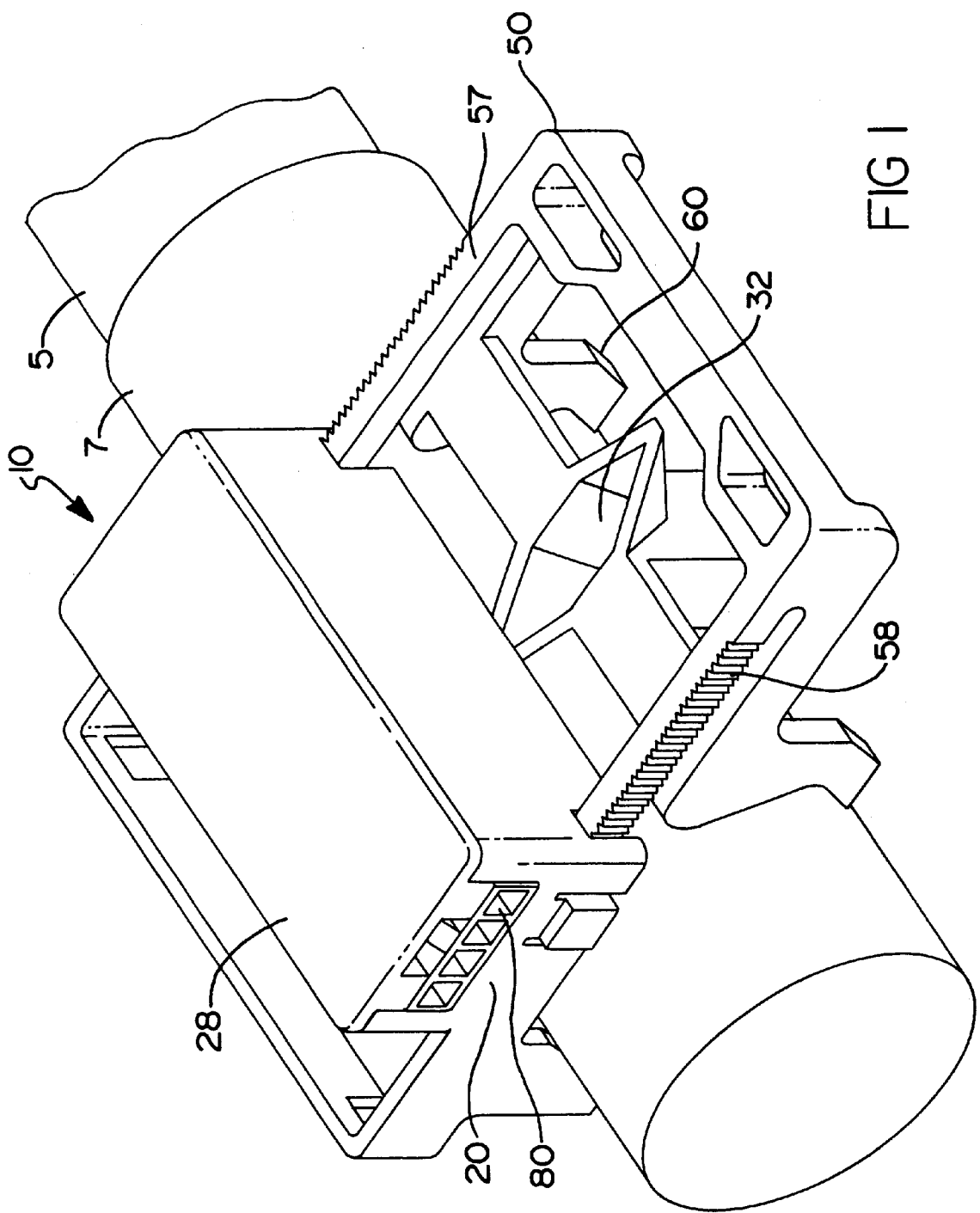
FIG. 1 is a perspective view of the sensor assembly of the present invention shown attached to a round electrical conductor.
Figure 2:
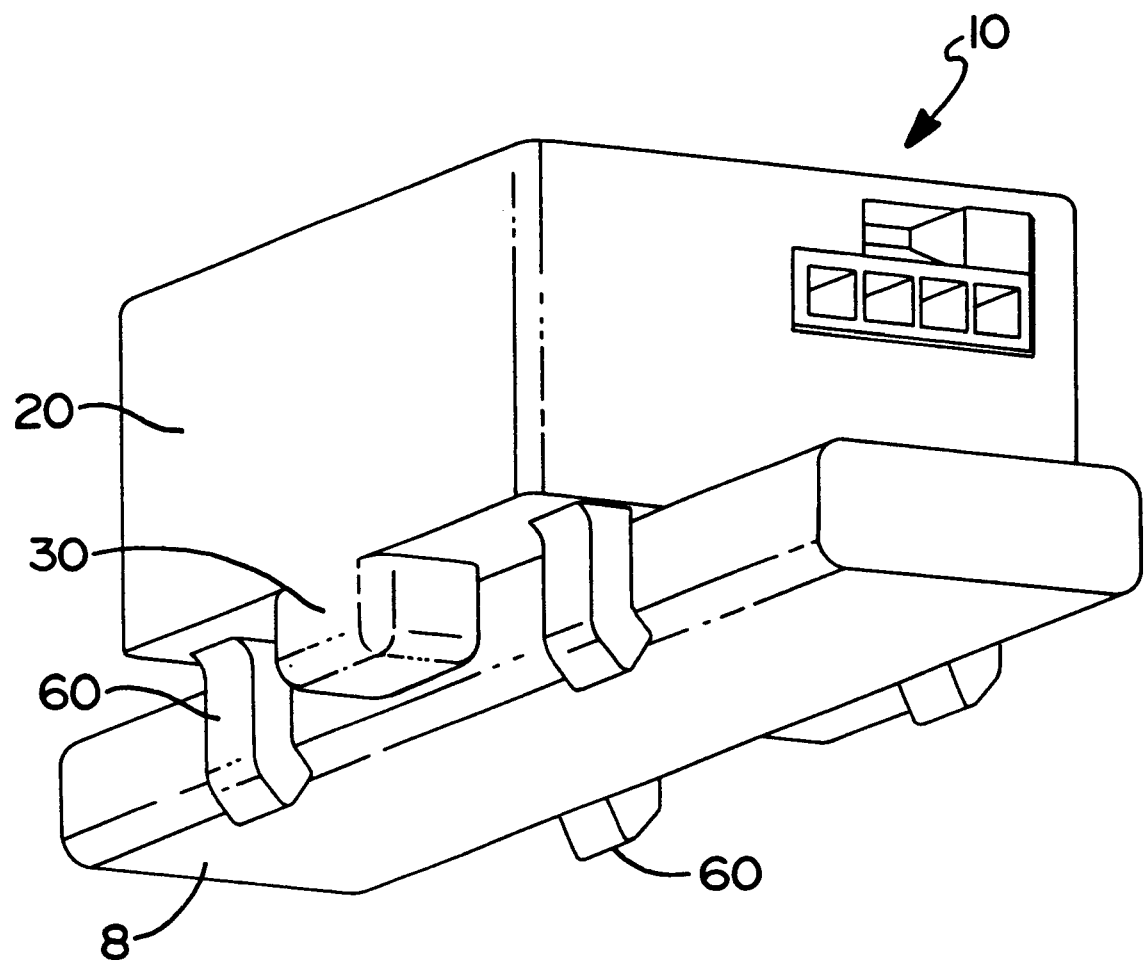
FIG. 2 is a perspective view of an alternate embodiment of the sensor assembly of the present invention.

A sensor assembly 10 for attachment to an electrical conductor 5 is shown in FIG. 1. More specifically, the sensor assembly 10 is attached to an insulator 7 surrounding the electrical conductor 5. With reference also to FIG. 2, sensor assembly 10 includes a base 20 and a pair of detector housings 30 extending from the base 20. The detector housings 30 each have a cavity 32 for receiving a magnetic field detector [not shown]. One example of a magnetic field detector is a hall sensor. It should becoming apparent to those skilled in the art that one or both detector housings 30 may be attached directly to the base 20 or attached to the base 20 through an intermediate member (not shown) disposed between the base 20 and one of the detector housings 30. As can be seen in FIG. 2 the detector housings 30 extend directly from the base 20. In contrast, FIG. 1 reveals one of the pair of detector housings 30 attached to a selectively extendable member 50 which extends from the base 20. The extendable member 50 cooperates with the base 20 to adjust the space between the pair of detector housings 30.

Figure 3:
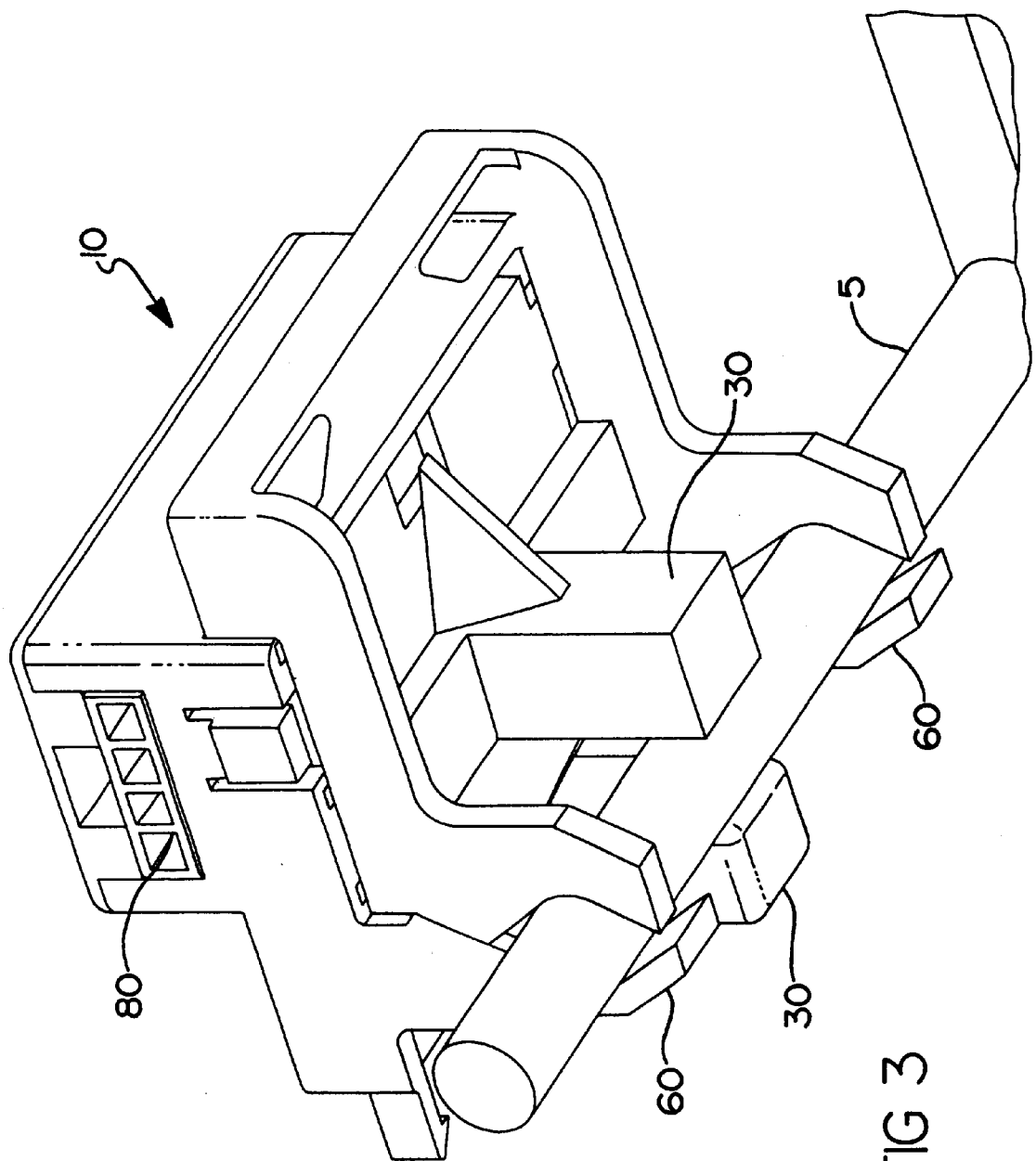
FIG. 3 is a perspective view of the sensor assembly of FIG. 1 from the underside to reveal the detector housings and two pairs of jaws.

Referring now also to FIG. 3 a pair of detector housings 30 are shown extending from a base 20 and in close proximity to an electrical conductor 5. To aide the assembly 10 in attachment to the electrical conductor 5 a pair of clamps 60 are provided for additional support. It is important that the detector housings 30 be laterally spaced and substantially parallel to one another.

Figure 4:
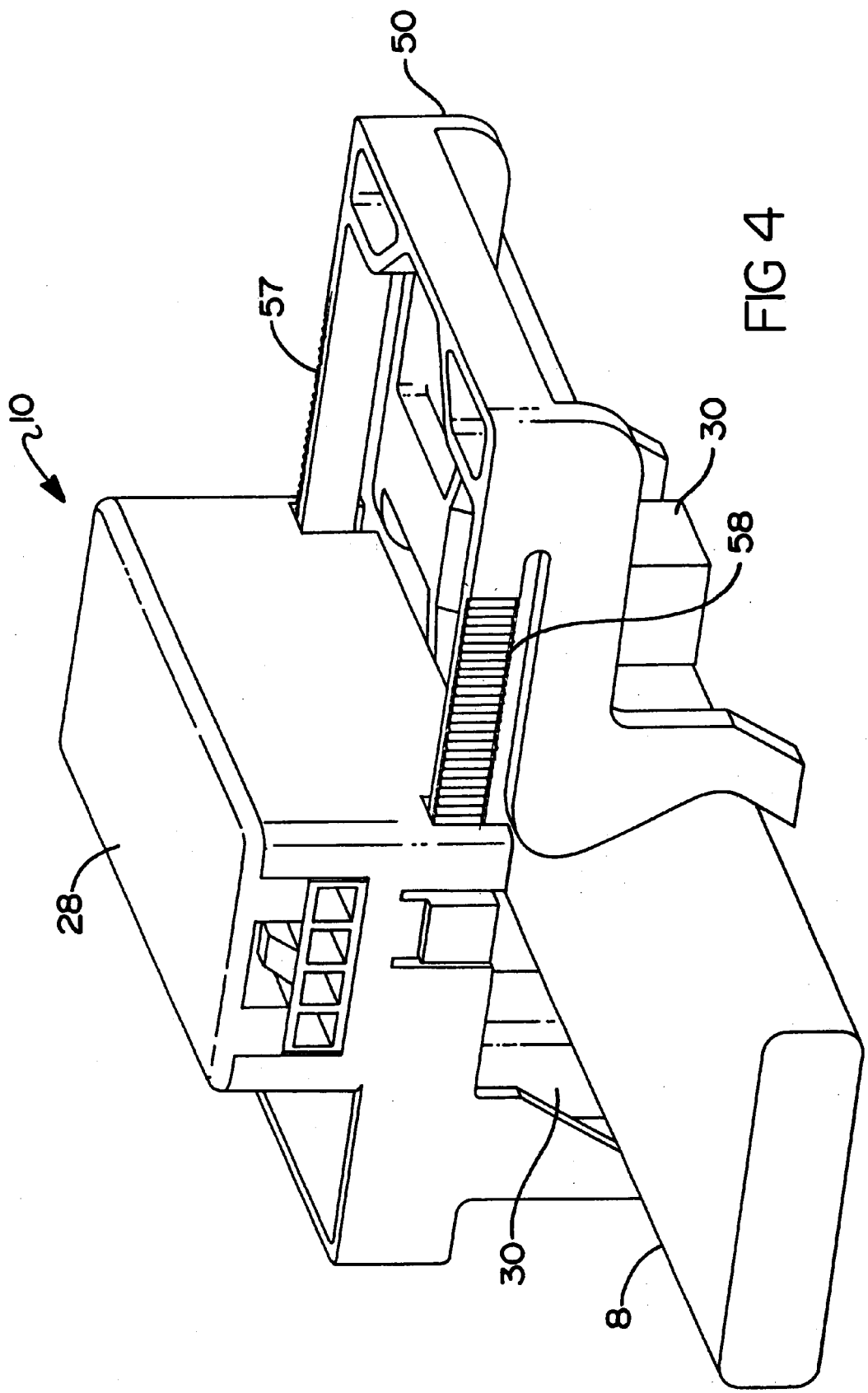
FIG. 4 is a perspective view of the sensor assembly of the present invention shown coupled to a bus bar.

Referring now to FIG. 4, assembly 10 is shown mounted upon a bus bar 8. The selectively extendable member 50 enables the assembly 10 to mount upon a wide variety of electrical conductors. In FIG. 4 a pair of resiliently flexible ratchet members 57 having a series of teeth 58 are provided to adjust the space between the pair of detector housings 30. Adjustment of the extendable member 50 is achieved by inwardly depressing the resiliently flexible ratchet members 57 which allows one or more of the series of teeth 58 to dislodge from a contact point on the base 20, allowing the extendable member 50 to translate to and from the base 20. Those skilled in the art will immediately recognize that only one resiliently flexible ratchet member 57 needs to be provided in order to serve the intended purpose of fixably positioning the detector housings 30 relative to one another and for mounting the assembly 10 upon a conductor.

Figure 5:
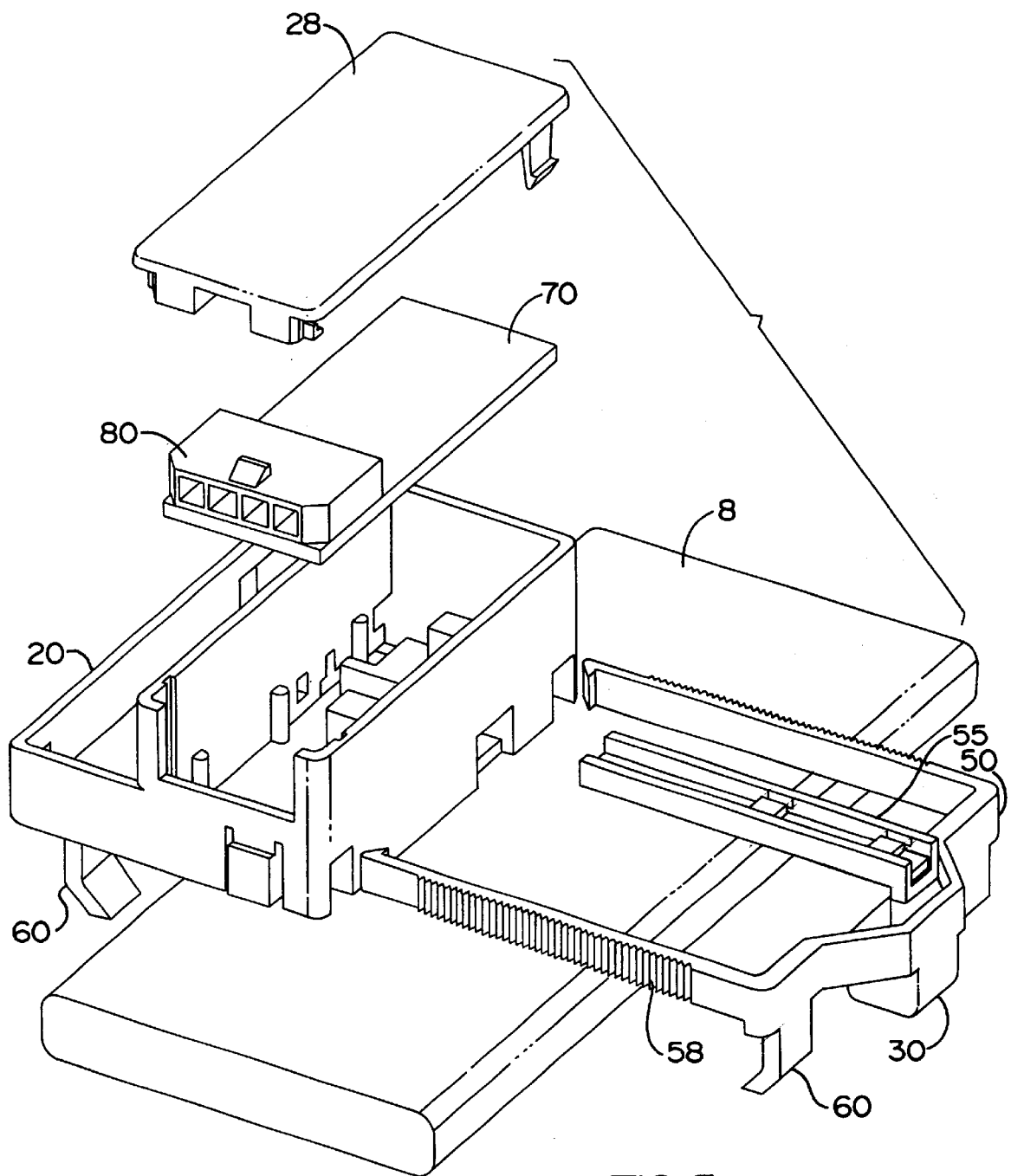
FIG. 5 is a exploded perspective view of the sensor assembly revealing the operative elements therein.

Referring now to FIG. 5, an exploded view of a sensor assembly 10 is shown revealing, in pertinent part, the base 20 having a cavity 22 disposed therein. An electronic circuit card 70 is disposed within the cavity 22. A cover 28 is provided to engage the base 20 to prevent dust, water and other foreign elements from entering base cavity 22 while allowing access to the contents of the cavity 22. A wire channel 55 extending from the selectively extendable member 50 is provided for routing a signal carrying element [not shown], such as a wire or optical cable, from a magnetic field detector disposed within the cavity 32 of the detector housing 30 to the electronic circuit card 70. The signal carrying element is operatively coupled to the electronic circuit card 70. The wire channel 55 prevents the signal carrying element from tangling when the extendable member 50 is translated to and from the base 20 as to accommodate for a variety of conductor sizes such as the bus bar 8. The electronic circuit card 70 may contain logic for manipulating the signals coming from the pair of magnetic field detectors, the output of which is provided through a plug connector 80.

Figure 6:
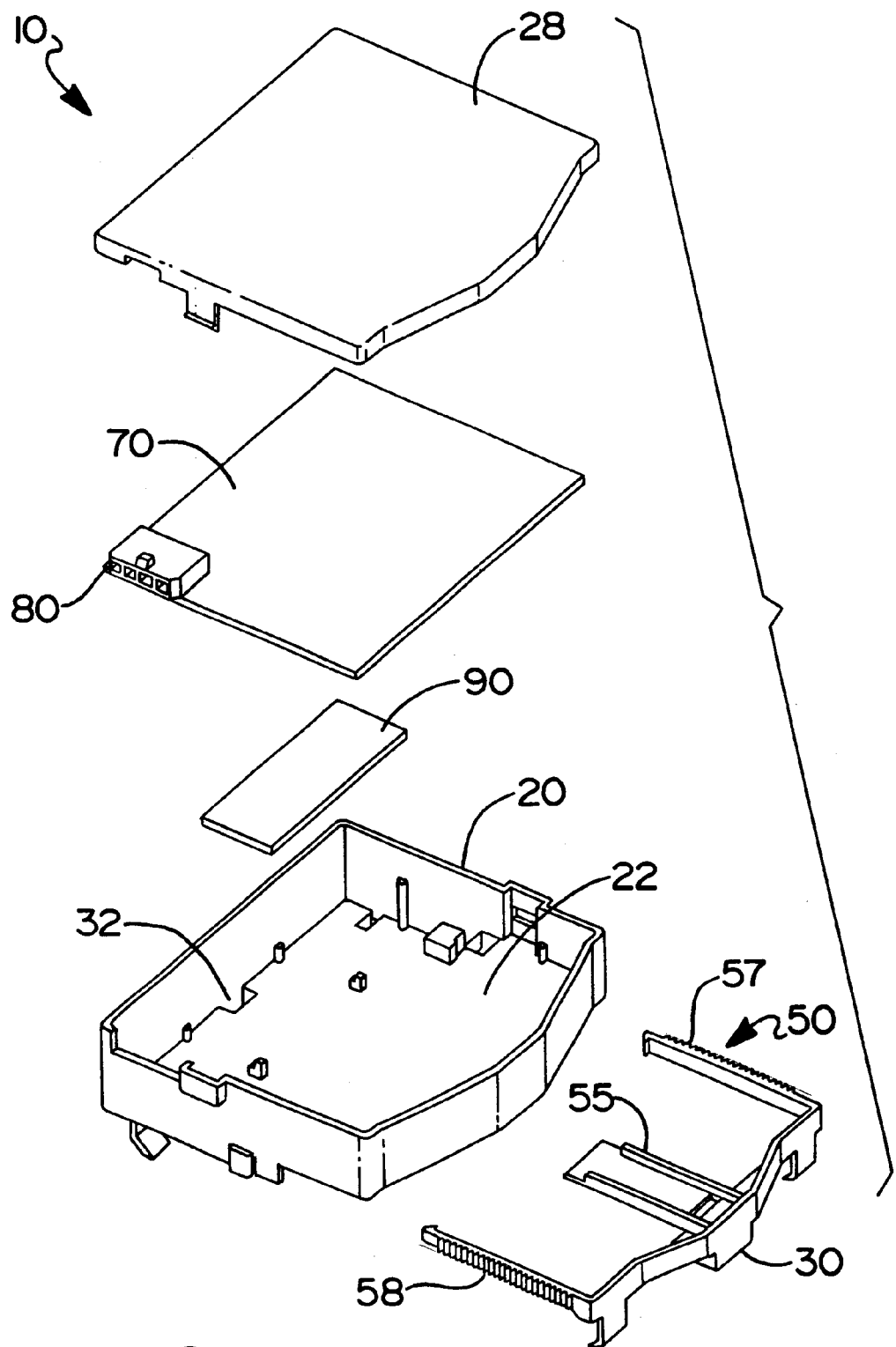
FIG. 6 is an exploded perspective view of an alternate embodiment of the present invention revealing an auxiliary circuit card.

Referring now to FIG. 6 an exploded view of an alternate embodiment of assembly 10 is shown including an auxiliary circuit card 90 for communicating with the electronic circuit card 70. Auxiliary circuit card 90 may include additional logic. In the preferred embodiment auxiliary circuit card 90 contains logic for detecting an arc fault.

The forgoing discussion discloses and describes the preferred embodiment of the present invention. However, one skilled in the art will readily recognize from such discussion and the accompanying drawings and claims that various changes, modifications and variations can be made therein without departing from the true spirit and fair scope of the invention as defined in the following claims.

What is claimed is:

1. A sensor assembly (10) for attachment to an electrical conductor (5), comprising:

a base (20) having a cavity (22);

a pair of detector housings (3) extending forms aid base (20), said detector housings (30) being laterally spaced and substantially parallel, each of said detector housings (30) having a cavity (32) for receiving a magnetic field detector; and a selectively extendable member (50) extending from said base (20), said extendable member (50) in cooperation with said base (20) to adjust the space between said pair of detector housings (30).

2. The sensor assembly (10) of claim 1, wherein at least one of said pair of detector housings (30) is attached to said base (20).

3. The sensor assembly (10) of claim 1, wherein one of said pair of detector housings (30) is attached directly to said base (20) and the other of said pair of detector housings (30) is attached to said base (20) by an intermediate member (25).

4. The sensor assembly (10) of claim 1, wherein said selectively extendable member (50) includes a wire channel (55).

5. The sensor assembly (10) of claim 1, wherein said selectively extendable member (50) includes at least one resiliently flexible ratchet member (57) having a series of teeth (58) disposed thereon for cooperation with said base (20).

6. The sensor assembly (10) of claim 1, further comprising at least one pair of jaws (60) for attaching the sensor assembly (10) to an electrical conductor (5).

7. The sensor assembly (10) of claim 1, further comprising a magnetic field detector disposed in each of said detector housings (30); an electronic circuit card (70) disposed within said base cavity (22) and operatively coupled to said magnetic field detectors; and a plug connector (80) operatively connected to said electronic circuit card (70).

8. The sensor assembly (10) of claim 7, further comprising an auxiliary circuit card (90) for communicating with said electronic circuit card (70).

9. The sensor assembly (10) of claim 8, wherein said auxiliary circuit card (90) contains logic for detecting an arc fault.

* * * * *